United States Patent
Nguyen et al.

(10) Patent No.: US 7,932,755 B2
(45) Date of Patent: **\*Apr. 26, 2011**

(54) PHASE SYNCHRONIZATION FOR WIDE AREA INTEGRATED CIRCUITS

(75) Inventors: Huy M. Nguyen, San Jose, CA (US); Benedict C. Lau, San Jose, CA (US); Leung Yu, Santa Clara, CA (US); Jade M. Kizer, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 1147 days.

This patent is subject to a terminal disclaimer.

(21) Appl. No.: 11/620,309

(22) Filed: Jan. 5, 2007

(65) Prior Publication Data

US 2007/0124636 A1    May 31, 2007

Related U.S. Application Data

(63) Continuation of application No. 10/963,698, filed on Oct. 13, 2004, now Pat. No. 7,161,400, which is a continuation of application No. 10/633,831, filed on Aug. 4, 2003, now Pat. No. 6,861,884.

(51) Int. Cl.
*H03L 7/06* (2006.01)

(52) U.S. Cl. ................. 327/155; 327/147; 327/295

(58) Field of Classification Search .......... 327/141, 327/155, 165; 365/233.1, 233.5, 233.11; 375/354, 356, 362; 713/400, 401, 500, 503
See application file for complete search history.

(56) References Cited

U.S. PATENT DOCUMENTS

| | | | |
|---|---|---|---|
| 3,104,330 | A | 9/1963 | Hamilton |
| 4,998,262 | A | 3/1991 | Wiggers |
| 5,122,679 | A | 6/1992 | Ishii |
| 5,243,703 | A | 9/1993 | Farmwald et al. |
| 5,319,755 | A | 6/1994 | Farmwald et al. |
| 5,361,277 | A | 11/1994 | Grover |
| 5,570,053 | A | 10/1996 | Takla |
| 5,686,845 | A | 11/1997 | Erdal et al. |
| 6,323,714 | B1 | 11/2001 | Naffziger |
| 6,525,588 | B2 | 2/2003 | Saeki |
| 6,538,957 | B2 | 3/2003 | Magoshi |
| 6,630,855 | B2 | 10/2003 | Fayneh |
| 2003/0197537 | A1 | 10/2003 | Saint-Laurent |
| 2004/0232956 | A1* | 11/2004 | Nguyen et al. ............... 327/141 |

OTHER PUBLICATIONS

Dally, William J. & Poulton, John W., "Digital Systems Engineering," Press Syndicate of the University of Cambridge, The Pitt Building, Trumpington Street, Cambridge CB2 IRP, United Kingdom, 1998, pp. 449-457.

\* cited by examiner

*Primary Examiner* — Lincoln Donovan
*Assistant Examiner* — William Hernandez
(74) *Attorney, Agent, or Firm* — Vierra Magen Marcus & DeNiro LLP

(57) ABSTRACT

A circuit and method for synchronized clocking of components such as registers. Registers are clocked by individual component clock signals having the same frequency but potentially different phases due to differing propagation delays. Separate component clock signals are received by registers are brought into phase by evaluating the phases of the component clock signals at the registers, and synchronizing the component clock signal of each register to that of the previous register in a sequence.

13 Claims, 4 Drawing Sheets

PHASE SYNCHRONIZATION FOR WIDE AREA INTEGRATED CIRCUITS

PRIORITY DATA

This application is a continuation of U.S. patent application Ser. No. 10/963,698 filed on Oct. 13, 2004, now U.S. Pat. No. 7,161,400, which application is a continuation of U.S. patent application Ser. No. 10/633,831 filed on Aug. 4, 2003, now U.S. Pat. No. 6,861,884.

TECHNICAL FIELD

The invention relates to clock signal synchronization in integrated circuits.

BACKGROUND

Integrated circuits (IC), including application specific integrated circuits (ASIC), are increasing in processing capability and are shrinking in physical size. Smaller ICs contain added components such as digital receiving and processing devices. Decreasing the size of ICs has led to an increase in IC processing speed since communication paths are decreased between IC components.

As IC size decreases, however, resistance-capacitance (RC) time delay of metal interconnects between IC components begins to limit IC performance. Interconnect RC time delay is associated with metal resistance of interconnections and capacitance associated with dielectric media. Because metal resistance and dielectric media are inherently part of the materials used in construction of an IC, only a change in materials will affect (improve) RC time delay. A change in materials may be technically impossible or cost prohibitive.

Differences in propagation delay, when compounded across all interconnections, such as clock nets or paths, in a complex IC may lead to unacceptable degradations in overall system-timing. This problem is often referred to as "clock skew."

FIG. 1 illustrates a clock tree that distributes clock signals in a controlled manner. An IC may contain numerous clocked components requiring clock signals. A clock tree or similar clock architecture provides the necessary clock signals to the components. Components within an IC, specifically registers of the components, may require that the clock signals be synchronized. To be considered "synchronized," clock signals have the same phase at different receivers, despite propagation delays.

In this particular example, clock receiving components 10, 15, 20, and 25 reside on a single IC. Components 10, 15, 20, and 25 may be at varying distances from one another. In other words component 10 may be an unequal distance from component 15, as component 15 is to component 20. Oftentimes, due to IC design constraints or physical architecture restrictions on an IC, components must be placed at varying locations at varying distances from one another. In this example, components 10, 15, 20, and 25 are components that must be synchronized with one another (i.e. have the same phase clock signals). Further, since components are placed at varying distances from one another, components may also be located at varying distances from a clock source such as clock driver 30. Since clock signals travel over varying distances from the clock source to the components, assuring that each clock signal is in phase with the other clock signals becomes a complicated task.

In typical clock architectures such as the clock tree of FIG. 1, a controller such as controller 35 initiates a clock signal. Controller 35 can be located on an IC (on-chip) or external to an IC (off-chip). Controller 35 instructs clock driver 30 to generate a clock signal. Clock driver 30 may be implemented for example as a clock oscillator or clock generator or similar component. Alternatively, clock driver 30 may be a clock buffer. A clock signal transmitted by clock driver 30 is passed on to fan-out clock drivers 40, 45, 50, 55, 60, and 65. All clock signals derived from clock driver 30 have the same frequency, although clock signals arriving at various components or registers may have different phase values.

To assure that the clock signals arriving at components 10, 15, 20, and 25 are properly synchronized and have the same phase, paths 70, 75, 80, and 85 must have approximately the same length and propagation delay characteristics. If components 10, 15, 20, and 25 are not located equidistant from their respective clock drivers 50, 55, 60, and 65, certain paths may have to be wrapped around to assure equal lengths and propagation characteristics of all paths. When IC space is at a premium, this approach may not be feasible.

DETAILED DESCRIPTION

Figure 1:
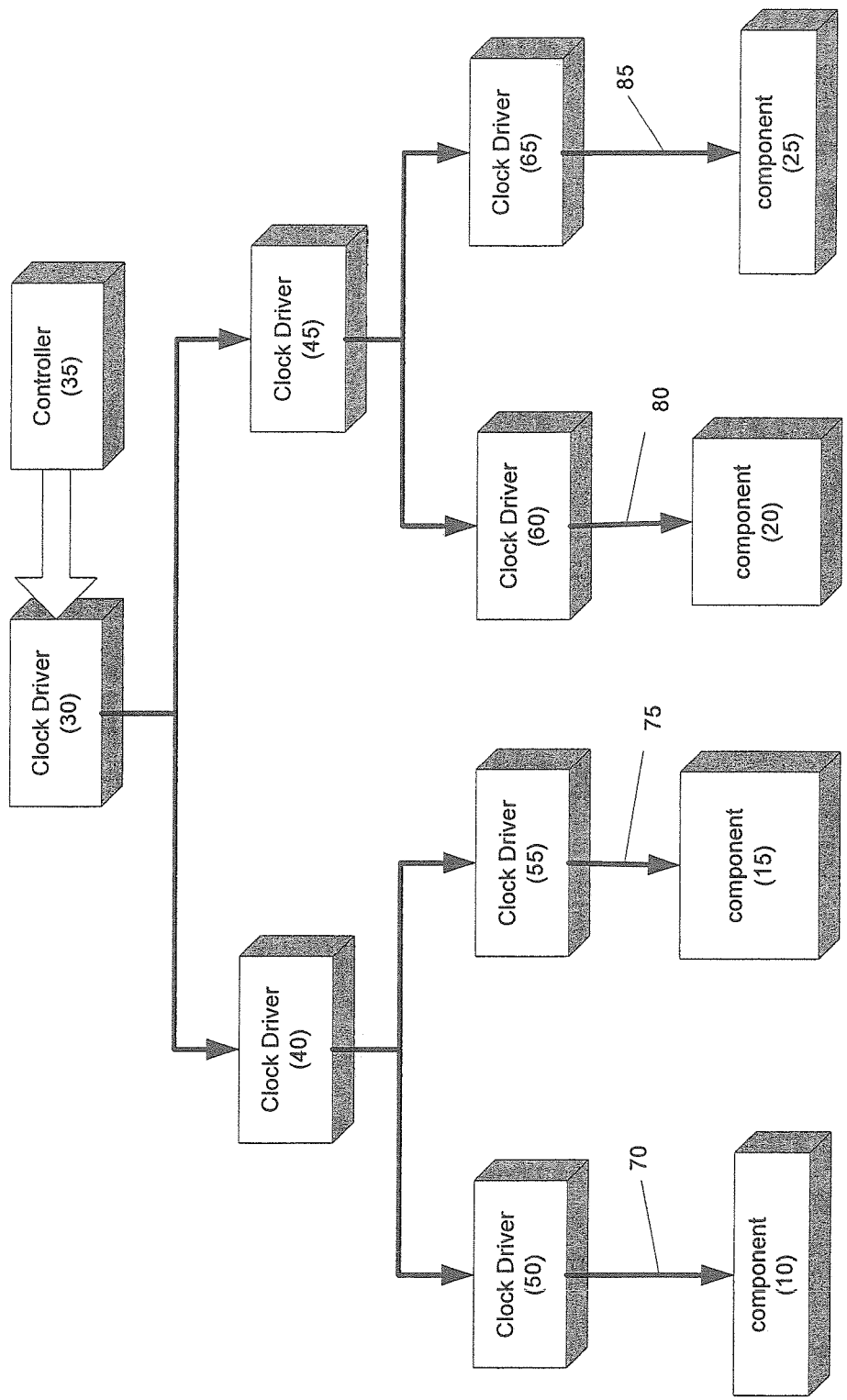
FIG. 1 is a clock tree diagram in accordance of the prior art.
Figure 2:
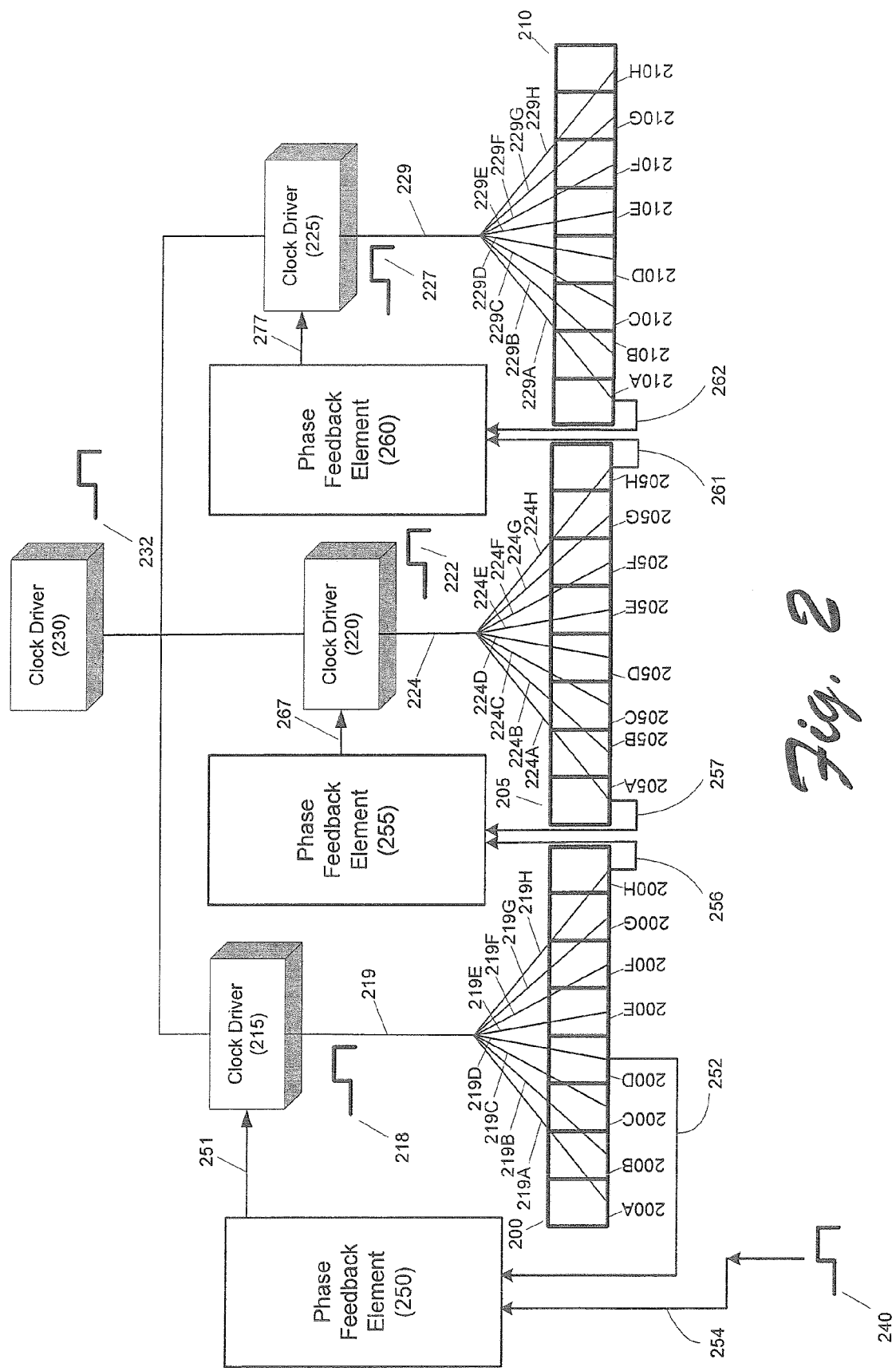
FIG. 2 is a schematic illustrating component synchronization for multiple registers in an IC.

FIG. 2 illustrates a circuit having registers that are to be synchronously clocked. Specifically, this circuit has a plurality of components 200, 205, and 210. In this example, each component comprises one or more multi-bit or byte-word registers. Each byte-word register might have eight individual bit registers, as shown, or some other number of bit registers, typically from 8 to 16 bit registers. In certain other embodiments, all bit registers might be treated as separate registers.

In FIG. 2, component 200 is made up of bit registers 200A-H. Component 205 is made up of bit registers 205A-H. Component 210 is made up of bit registers 210A-H. In this example, bit registers 200A-H, 205A-H, and 210A-H make up a continuous string of bit registers. In other words, bit registers 200A-H, 205A-H, and 210A-H are physically laid out contiguous to one another (side by side). Bit registers 200A-H, 205A-H, and 210A-H may be arranged in a particular sequence. For example, for a pair of components, the last bit register of a first component may be located adjacent the first bit register of a second component. Therefore, bit register 200H is placed directly adjacent to bit register 205A, and bit register 205H is placed directly adjacent to bit register 210A. Logically, however, bit registers 200A-H, 205A-H, and 210A-H are configured to comprise separate components (i.e., they are logically part of components 200, 205, and 210). As separate components, bit registers 200A-H, 205A-H, and 210A-H receive separate component clock signals.

Components 200, 205, and 210 and their respective bit registers are intended to be synchronized with one another. In other words, these components are intended to be synchronously clocked. To achieve this, component clock signals to each byte-word register are adjusted to have matching phases at the byte-word registers, after accounting for any differing propagation delays of the component clock signals. A factor determining propagation delay difference is the difference between the lengths of the paths. In a preferred embodiment, the difference between propagation delays is less than 15%.

The described embodiment includes a clock driver corresponding to each set of components, which in this case equates to a separate clock driver for each respective byte-word register. Thus, a clock driver 215 provides a component clock signal 218 to bit registers 200A-H of component 200. Component clock signal 218 travels along a path 219 from clock driver 215. Path 219 branches out to sub-paths 219A-H which lead to individual bit registers 200A-H, respectively. Clock driver 220 provides a component clock signal 222 to bit registers 205A-H of component 205. Component clock signal 222 travels along a path 224 from clock driver 220. Path 224 branches out to sub-paths 224A-H which lead to individual bit registers 205A-H, respectively. Clock driver 225 provides a component clock signal 227 to bit registers 210A-H of component 210. Component clock signal 227 travels along a path 229 from clock driver 225. Path 229 branches out to sub-paths 229A-H which lead to individual bit registers 210A-H, respectively. Therefore, the clock drivers 215, 220, and 225 provide separate clock signals to each of the bit registers 200A-H, 205A-H, and 210A-H by way of separate paths.

Clock driver 215, 220, and 225 may receive input clock signals from a common source such as a clock tree. Such a clock tree architecture may be part of the same IC in which components 200, 205, and 210 reside or may be part of another IC.

In this example, a master clock driver 230 produces a common clock signal 232 that branches out to clock drivers 215, 220, and 225. Since clock drivers 215, 220, and 225 derive respective component clock signals 218, 222, and 227 from common clock signal 232, each of the component clock signals is a variably-delayed version of common clock signal 232.

Since component clock signals 218, 222, and 227 originate from a common clock signal source, they have the same frequency. However, as component clock signals 218, 222, and 227 travel across respective paths 219, 224, 229, and the sub-paths leading to individual bit registers, component clock signals 218, 222, and 227 traverse potentially different distances. Different distances result in differing propagation delays, which result in component clock signals that are potentially out of phase with each other as they are received at the respective components 200, 205, and 210. Clock drivers 215, 220, and 225 are capable of varying the phase of component clock signals 218, 222, and 227 so that the phases of the component clock signals 218, 222, and 227 are synchronized upon arrival at the bit registers of components 200, 205, and 210.

A reference clock signal 240 is used to correct the phases of component clock signals 218, 222, and 227, so that they are in phase with each other at the physical locations of the byte-word registers 210, 215, and 220. Reference clock signal 240 has the same frequency as clock signals 218, 222, and 227. Reference clock signal 240 may be generated by an arbitrary clock source; however, it is contemplated that reference clock signal 240 may be provided by or derived from the same clock tree or clock architecture from which component clock signals 218, 222, and 227 are derived. In certain cases, one of clock signals 218, 222, and 227 may be branched and used as reference clock signal 240. It is not necessary for reference clock signal 240 to have any particular phase relationship with the component clock signals 218, 222, and 227, although its phase preferably remains constant over time as compared to the component clock signals.

The circuit of FIG. 2 has a reference feedback element 250 that receives component clock signal 218 from path 252. Path 252 is a continuation of one of the sub-paths 219A-H and originates from near register 200. In this example, path 252 is connected to path 219D. Reference clock signal 240 travels along path 254 to reference phase feedback element 250. Reference phase feedback element 250 compares the phases of component clock signal 218 and reference clock signal 240, and provides an adjustment signal 251 to clock driver 215. Adjustment signal 251 represents an advance or delay value that allows component clock signal 218 to become in phase with reference clock signal 240. An adjusted component clock signal 218 may then be used as a reference clock signal for other component clock signals. In other words, when the components are considered in sequence, the component clock signal to any particular component is matched in phase to the component clock signal of the immediately preceding component in the sequence.

Note that in certain embodiments, reference clock signal 240 may not be used. In this case, the component clock signals of the components are simply synchronized to that of the first component in the sequence.

In addition to reference phase feedback element 250, the circuit includes phase feedback elements 255 and 260 corresponding to adjacent pairs of components. The phase feedback element corresponding to a particular pair of components receives the component clock signal from a register of each of the components of the particular pair. The component clock signal in each case is routed from a point physically near its corresponding register (of the corresponding component). The phase feedback element is responsive to the received component clock signals to adjust the phase of one of the component clock signals to match the phase of the other component clock signal. More particularly, each phase feedback element receives a first component clock signal from a particular register and a second component clock signal from an immediately subsequent register in sequence, and adjusts the second component clock signal to match the phase of the first component clock signal.

With specific reference to FIG. 2, phase feedback element 255 receives component clock signal 218 from path 256, and component clock signal 222 from path 257. Path 256 is a continuation of one of the sub-paths 219A-H, and path 257 is a continuation of one of the sub-paths 224A-H. In this example, path 256 continues sub-path 219H and path 257 continues sub-path 224A. Sub-paths 219H and 224A may and are expected to differ in length. To assure that component clock signals 218 and 222 have the same phase at the respective registers, paths 256 and 257 should be equal in length and have the same or similar propagation delay characteristics. A factor determining propagation delay difference is the difference between the lengths of the paths. In a preferred embodiment, the difference between propagation delay of length of paths 256 and 257 is less than 15%.

Paths 256 and 257 couple their respective components to phase feedback element 255. Phase feedback element 255 determines the phase difference between component clock signals 218 and 222, and generates an adjustment signal 267, which is provided to clock driver 220 in either analog or digital form (analog skew or digital skew values). Adjustment signal 267 is a measure of an advance or delay that allows component clock signal 222 to become in phase with component clock signal 218. An adjusted clock signal 222 may then be used as a "reference clock" signal for other component clock signals.

In a similar manner, phase feedback element 260 receives component clock signal 222 from path 261, and component clock signal 227 from path 262. Path 261 is a continuation of one of the sub-paths 224A-H, and path 262 is a continuation of one of the sub-paths 229A-H. In this example, path 261 continues sub-path 224H and path 262 continues sub-path 229A. Sub-paths 224H and 229A may and are expected to differ in length. To assure that component clock signals 222 and 227 have the same phase at the respective registers, paths 261 and 262 should be equal in length and have the same propagation delay characteristics.

Paths 261 and 262 couple their respective components to phase feedback element 260. In this example, phase feedback element 260 corresponds to the adjacent pair of components 200 and 205. Phase feedback element 260 determines the phase difference between component clock signals 218 and 222, and generates an adjustment signal 277 which is provided to clock driver 225 in either analog or digital form (analog skew or digital skew values). Adjustment signal 277 is a measure of an advance or delay that allows component clock signal 227 to become in phase with component clock signal 222. Since component clock signal 222 has been adjusted to match the phase of component clock signal 218, it follows that component clock signal 227 is adjusted to match the phase of component clock signal 218.

Although this example describes synchronization of component clock signals from a left to right sequence beginning with a left most component, it is contemplated that synchronization may start with any component clock signal, including a component clock signal received at a middle component (byte-word register) or middle bit register.

Figure 3:
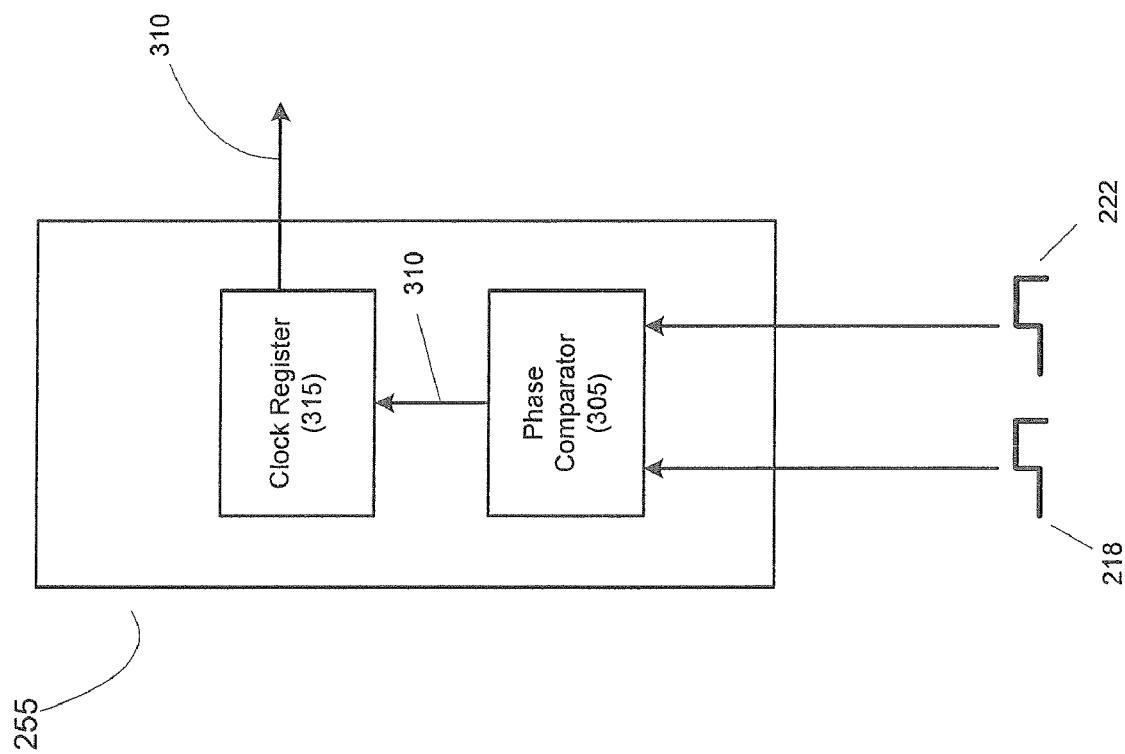
FIG. 3 is a schematic illustrating a phase feedback element that makes use of a phase comparator and clock skew register.

FIG. 3 illustrates an exemplary embodiment of phase feedback element 255. Phase feedback element 260 is similarly implemented. This implementation of feedback element 255 is particularly appropriate in circuits where components or registers have 10 or fewer bits.

Phase feedback element 250 includes a phase comparator 305. Phase comparator 305 receives component clock signals from a pair of components; allowing the phase feedback element to adjust the phase of one of the component clock signals to match that of the other component clock signal. In particular examples, the phase comparator 305 receives a clock signal from a first bit register of a plurality of bit registers in a component and a clock signal from a last bit register of a plurality of bit registers in a second component. The clock signals from these bit registers may be routed through paths that have matched lengths. In this example, phase comparator 305 receives component clock signals 218 and 222, and determines the phase difference between component clock signals 218 and 222. Phase comparator 305 may include a phase converter that converts the phase difference to a phase offset value or digital skew time value 310. Digital phase offset value or digital skew time value 310 may be stored in a clock register 315. Based on digital phase offset value or digital skew time value 310, clock register 315 instructs clock driver 220 to advance or delay transmission of component clock signal 222. Digital phase offset value or digital skew time value 310 is used as adjustment value 267 of FIG. 2.

Figure 4:
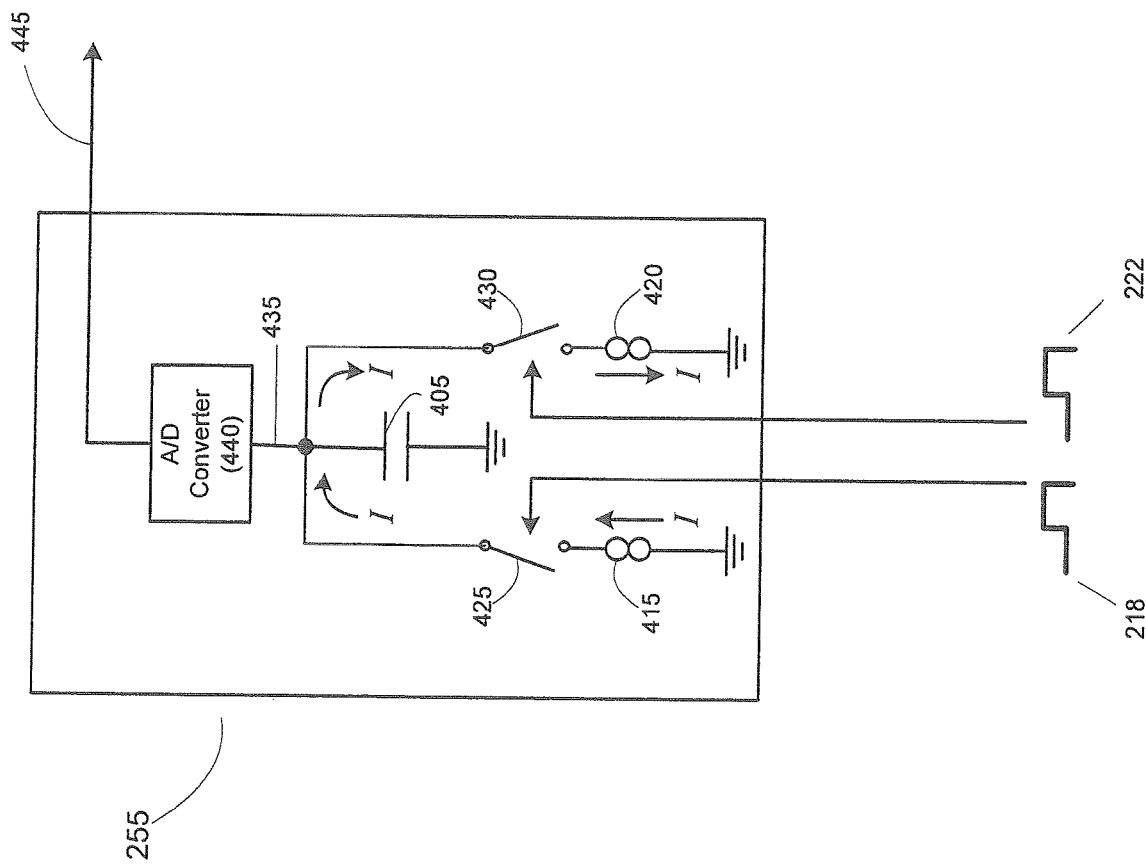
FIG. 4 is a schematic illustrating a phase feedback element that makes use of matched current sources.

Referring now to FIG. 4, illustrated is an exemplary embodiment of a phase feedback element 255 using current sources. Phase feedback element 260 is similarly implemented. This implementation is particularly appropriate in circuits having more than 10 bits in each component or register.

In this embodiment, phase feedback element 255 has an integrator or capacitance 405 and current sources 415 and 420. Current sources 415 and 420 are controlled by switches 425 and 430, respectively. Current source 415 corresponds to component 200 and current source 420 corresponds to component 205, where in this example components 200 and 205 are treated as a pair. Switches 425 and 430 are preferably implemented as transistors. Current sources 415 are connected through the respective switches 425 and 430 to charge and discharge capacitance 405. Specifically, current source 415 is connected through and enabled by switch 425 to charge capacitance 405 when switch 425 is closed. Current source 420 is connected through and enabled by switch 430 to discharge capacitance 405 when switch 430 is closed. Current sources 415 and 420 preferably source equal currents, albeit in opposite directions. In other words, current sources 415 and 420 are matched current sources.

Switches 425 and 430 are selectively enabled or controlled by the component clock signals of the two adjacent components corresponding to phase feedback element 255, in this case by component clock signals 218 and 222. Switch 425 is closed when component clock signal 218 is logically true or high, and is open when component clock signal 218 is logically false or low. Switch 430 is closed when component clock signal 222 is logically true or high and is open when component clock signal 222 is logically false or low. If the component clock signals 218 and 222 are in phase, switches 425 and 430 close and open at the same times, and the net effect of the opposite current sources 415 and 420 is null—the capacitance 405 is neither charged nor discharged.

If, on the other hand, component clock signals 218 and 222 are out of phase, switches 425 and 430 do not close and open at the same times, and there is a net charging or discharging effect on capacitance 405. Assuming a relatively large capacitance 405, the voltage at the capacitance will increase or decrease, relative to ground, in accordance with any phase difference between the two component clock signals 218 and 222. Thus, the voltage at capacitive node 435 represents a phase difference between component clock signals 218 and 222. In the illustrated embodiment, phase feedback element 255 has an analog to digital (A/D) converter 440 that converts the analog skew or voltage value at capacitive node 435 to a digital skew time value 445. Clock driver 220 advances or delays component clock signal 222 based on digital skew time value 445. Clock driver 220 therefore is responsive to the voltage value at capacitive node 435. In other embodiments, analog skew value 435 is passed directly on to clock driver 220.

Although details of specific implementations and embodiments are described above, such details are intended to satisfy statutory disclosure obligations rather than to limit the scope of the following claims. Thus, the invention as defined by the claims is not limited to the specific features described above. Rather, the invention is claimed in any of its forms or modifications that fall within the proper scope of the appended claims, appropriately interpreted in accordance with the doctrine of equivalents.

The invention claimed is:

1. A circuit comprising:
    a first clock circuit to output a first clock signal;
    a second clock circuit to output a second clock signal in response to a phase adjust signal;
    a first register to receive the first clock signal;
    a second register to receive the second clock signal; and
    a phase comparator circuit to receive the first and second clock signals, the phase comparator circuit to output the phase adjust signal in response to the first and second clock signals.

2. The circuit of claim 1 wherein the second clock circuit outputs the second clock signal that matches in phase with the first clock signal in response to the phase adjust signal.

3. The circuit of claim 1 wherein the first register includes a first plurality of contiguous bit registers and the second register includes a second plurality of contiguous bit registers, wherein the first clock signal is provided to a last bit register in the first plurality of contiguous bit registers and the second clock signal is provided to a first bit register in the second plurality of contiguous bit registers.

4. The circuit of claim 3 further comprising:
a first plurality of signal paths to provide the first clock signal to the first plurality of bit registers; and
a second plurality of signal paths to provide the second clock signal to the second plurality of bit registers.

5. The circuit of claim 1 further comprising a clock source to provide a common clock signal to the first and second clock circuits.

6. A circuit comprising:
a first clock circuit to output a first clock signal;
a second clock circuit to output a second clock signal in response to a phase adjust signal;
a first plurality of bit registers to receive the first clock;
a second plurality of bit registers to receive the second clock signal; and
a phase comparator circuit to receive the first clock signal from a last bit register in the first plurality of bit registers and receive the second clock signal from a first bit register in the second plurality of bit registers, the phase comparator circuit to output the phase adjust signal in response to the first and second clock signals.

7. The circuit of claim 6 wherein the second clock circuit outputs the second clock signal that is synchronized with the first clock signal in response to the phase adjust signal.

8. The circuit of claim 6 further comprising:
a third clock circuit to output a third clock signal in response to another phase adjust signal;
a third plurality of bit registers to receive the third clock signal; and
another phase comparator circuit to receive the second clock signal from the second plurality of bit registers and receive the third clock signal from the third plurality of bit registers, the another phase comparator circuit to output the another phase adjust signal in response to the second and third clock signals.

9. The circuit of claim 8 further comprising:
a first plurality of signal paths to provide the first clock signal to the first plurality of bit registers; and
a second plurality of signal paths to provide the second clock signal to the second plurality of bit registers.

10. The circuit of claim 9 further comprising a clock source to provide a common clock signal to the first, second and third clock circuits.

11. A method of operating an integrated circuit comprising:
providing a first clock signal on a first plurality of signal paths to a first component;
providing a second clock signal on a second plurality of signal paths to a second component;
providing the first and second clock signals from the first and second components to a phase feedback element;
comparing the first clock signal with the second clock signal; and
adjusting a second clock signal received at the second component to match a phase of the first clock signal received at the first component.

12. The method of claim 11, further comprising:
providing a third clock signal on a third plurality of signal paths to a third component;
providing the second and third clock signals from the first and second components to another phase feedback element;
comparing the second clock signal with the third clock signal; and
adjusting a third clock signal received at the third component to match a phase of the second clock signal received at the second component.

13. The method of claim 11, wherein the first and second components include a first and second plurality of bit registers coupled to the first and second plurality of signal paths.

* * * * *